US012725767B2

(12) United States Patent
Ravi et al.

(10) Patent No.: US 12,725,767 B2
(45) Date of Patent: Sep. 1, 2026

(54) FLUID CONDUIT AND FLANGE FOR HIGH BIAS APPLICATIONS

(71) Applicant: Applied Materials, Inc., Santa Clara, CA (US)

(72) Inventors: Sankaranarayanan Ravi, Santa Clara, CA (US); Alvaro Garcia, Mountain View, CA (US); Martin Perez Guzman, Santa Clara, CA (US); Stephen D. Prouty, San Jose, CA (US); Andreas Schmid, Meyriez (CH)

(73) Assignee: Applied Materials, Inc., Santa Clara, CA (US)

( * ) Notice: Subject to any disclaimer, the term of this patent is extended or adjusted under 35 U.S.C. 154(b) by 189 days.

(21) Appl. No.: 18/371,641

(22) Filed: Sep. 22, 2023

(65) Prior Publication Data

US 2024/0112894 A1 Apr. 4, 2024

Related U.S. Application Data

(60) Provisional application No. 63/412,266, filed on Sep. 30, 2022.

(51) Int. Cl.
*H01J 37/32* (2006.01)
*H10P 72/72* (2026.01)

(52) U.S. Cl.
CPC ...... *H01J 37/32724* (2013.01); *H10P 72/722* (2026.01); *H01J 2237/002* (2013.01); *H01J 2237/2007* (2013.01)

(58) Field of Classification Search
CPC ........... H01J 37/32724; H01J 2237/002; H01J 2237/2007; H01J 37/32715; H01L 21/6833; H01L 21/67103; H01L 21/67109; H01L 21/6831; H01L 21/68757
See application file for complete search history.

(56) References Cited

U.S. PATENT DOCUMENTS 5,078,851 A * 1/1992 Nishihata ............ H10P 72/0432 118/724
5,207,437 A * 5/1993 Barnes ..................... B23Q 3/15 279/128

(Continued)

FOREIGN PATENT DOCUMENTS

CN 108987229 A 12/2018
CN 112992634 A 6/2021

(Continued)

OTHER PUBLICATIONS

International Search Report dated Sep. 22, 2023 re: PCT/US2023/033467.

(Continued)

*Primary Examiner* — Thienvu V Tran
*Assistant Examiner* — Muaamar Qahtan Al-Taweel
(74) *Attorney, Agent, or Firm* — Patterson + Sheridan, LLP

(57) ABSTRACT

A method and apparatus for cooling a semiconductor chamber are described herein. A semiconductor chamber component, includes a powered region, a grounded region, and a fluid conduit disposed within the semiconductor chamber component and passing through the powered region and grounded region, the fluid conduit comprising a ceramic material.

20 Claims, 6 Drawing Sheets

(56) References Cited

U.S. PATENT DOCUMENTS

| | | | | |
|---|---|---|---|---|
| 5,250,137 | A * | 10/1993 | Arami ................. | H10P 72/0421<br>156/345.46 |
| 5,539,179 | A * | 7/1996 | Nozawa ............. | H01L 21/6831<br>279/128 |
| 5,936,829 | A * | 8/1999 | Moslehi ................ | C23C 16/463<br>279/128 |
| 6,646,233 | B2 * | 11/2003 | Kanno ................ | H10P 72/0434<br>118/724 |
| 7,815,740 | B2 * | 10/2010 | Oohashi ............. | H10P 72/0602<br>118/724 |
| 7,837,828 | B2 * | 11/2010 | Ikeda ................ | H01J 37/32431<br>118/724 |
| 9,608,550 | B2 * | 3/2017 | Comendant ............ | H02N 13/00 |
| 2004/0027781 | A1 * | 2/2004 | Hanawa ............. | H10P 72/0434<br>361/234 |
| 2018/0350610 | A1 | 12/2018 | Lingampalli et al. | |
| 2021/0296101 | A1 | 9/2021 | Prouty et al. | |
| 2021/0343512 | A1 | 11/2021 | Parkhe et al. | |

FOREIGN PATENT DOCUMENTS

| | | | |
|---|---|---|---|
| JP | H0745596 | A | 2/1995 |
| JP | 2003338492 | A | 11/2003 |
| JP | 2021506136 | A | 2/2021 |
| JP | 2022511107 | A | 1/2022 |
| TW | 202137374 | A | 10/2021 |
| TW | 202143377 | A | 11/2021 |
| WO | 2021188174 | A | 9/2021 |

OTHER PUBLICATIONS

Office Action for Korean Application No. 10-2025-7014064 mailed Dec. 31, 2025.

Taiwanese Office Action for Application No. 112136767 dated Mar. 9, 2026.

Office Action for Japanese Patent Application No. 2025-517744 mailed Jun. 2, 2026.

* cited by examiner

FLUID CONDUIT AND FLANGE FOR HIGH BIAS APPLICATIONS

CROSS-REFERENCE TO RELATED APPLICATIONS

This application claims benefit of U.S. Provisional Patent Application No. 63/412,266, filed Sep. 30, 2022, the entirety of which is herein incorporated by reference.

BACKGROUND

Field

Embodiments of the present disclosure generally relate to semiconductor chamber components, and more particularly to a cooled substrate support assembly for use in high frequency electric fields.

Description of the Related Art

Reliably producing nanometer and smaller features is one of the key technology challenges for next generation very large scale integration (VLSI) and ultra-large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

To drive down manufacturing cost, integrated chip (IC) manufactures demand higher throughput and better device yield and performance from every silicon substrate processed. Some fabrication techniques being explored for next generation devices under current development require processing at cryogenic temperatures. Dry reactive ion etching a substrate uniformly maintained at a cryogenic temperature enables ions to bombard the upward facing surfaces of materials disposed on the substrate with decreased spontaneous etching so that trenches with smooth, vertical sidewalls are formed. Additionally, selectivity of etching one material versus another can be improved at the cryogenic temperature. For example, selectivity between silicon (Si) and silicon dioxide ($SiO_2$) increases exponentially as temperature is decreased.

Operating a substrate support assembly to enable cryogenic temperature processing often relies on the use of coolants circulated through the substrate support assembly. As the conduits used to route the coolant span portions of the substrate support assembly that are both grounded and powered, the coolants must be sufficiently electrically insulative to prevent electrically shorting the substrate support assembly components to ground. However, in higher-bias power applications the conduits may experience cracking due to the higher DC voltages and ohmic heating experienced during high-bias radio frequency (RF) power applications. Stated differently, in high-bias power applications, the conduits may experience a higher parasitic current loss, causing the conduits to crack.

Thus, there is a need for an improved substrate support assembly including a conduit design that can withstand high-bias power processing recipes while coolants flowing at cryogenic temperatures are flowing therethough. A method and apparatus for cooling a semiconductor chamber are described herein according to one embodiment. A semiconductor chamber component, includes a powered region, a grounded region, and a fluid conduit disposed within the semiconductor chamber component and passing through the powered region and grounded region, the fluid conduit comprising a ceramic material.

SUMMARY

A method and apparatus for cooling a semiconductor chamber are described herein according to one embodiment. A semiconductor chamber component, includes a powered region, a grounded region, and a fluid conduit disposed within the semiconductor chamber component and passing through the powered region and grounded region, the fluid conduit comprising a ceramic material.

In another embodiment, A substrate support assembly the includes a facility plate, an insulator plate disposed between a ground plate and the facility plate, a fluid conduit disposed within the substrate support assembly disposed through the facility plate and insulator plate, and a connector coupled to the ground plate that houses a portion of the fluid conduit, the connector comprising a central opening having an inner diameter between about 0.7 inches and about 0.8 inches.

In another embodiment, a substrate support assembly including a facility plate, a ground plate coupled to the facility plate, a fluid conduit disposed within the substrate support assembly disposed through the facility plate and the ground plate, the fluid conduit comprising an outer surface surrounded by a polytetrafluoroethylene sleeve, and a connector coupled to the ground plate that houses a portion of the fluid conduit. The connector is couples a tubular member of the fluid conduit to the ground plate. The connector and the fluid conduit include a same ceramic material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of the disclosure and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide a substrate support assembly which enables a cryogenic temperature operation of an electrostatic chuck (ESC) so that a substrate disposed thereon is maintained at a cryogenic processing temperature suitable for processing while other surfaces of a processing chamber are maintained at a different temperature. The cryogenic processing temperature (i.e., temperature of the substrate) is intended to refer to temperatures less than −10° C. at the substrate support.

Also described herein is a substrate support assembly that includes one or more conduits for carrying a fluid within the substrate support assembly between powered and grounded portions of the substrate support assembly which is less prone to arcing and cracking at high-bias power levels. As the conduits described herein are less prone to arcing and cracking at high-bias power levels as compared to conduits used in conventional substrate support assemblies, the reliability, service interval and service life of the substrate support assembly is significantly improved. Although the conduit is primarily described as embodied in a substrate support assembly configured to enable cryogenic temperature operation, the conduit may be utilized in other substrate support assemblies or other semiconductor processing chamber components in which fluid is transferred in a conduit traversing grounded and powered portions of processing chamber components.

Also described herein is a substrate support assembly that includes one or more fluid conduits for carrying a fluid at cryogenic temperatures. The fluid conduits are configured to reduce arcing, reduce RF current loss to the fluid conduits from inadequate tube impedance, reduce ohmic heating from parasitic current, and reduce fluid conduit fractures caused by thermal expansion of components of the substrate support assembly.

The substrate support assembly described may be utilized in multiple types of plasma processing chambers, such as etch chambers, physical vapor deposition chambers, chemical vapor deposition chambers, ion implantation chambers, plasma treatment chambers, annealing chambers among others, and other systems where processing a substrate maintained at cryogenic processing temperatures are desirable. It is to be noted however, that the substrate support assemblies and chamber components described herein may be utilized at other processing temperatures.

Figure 1:
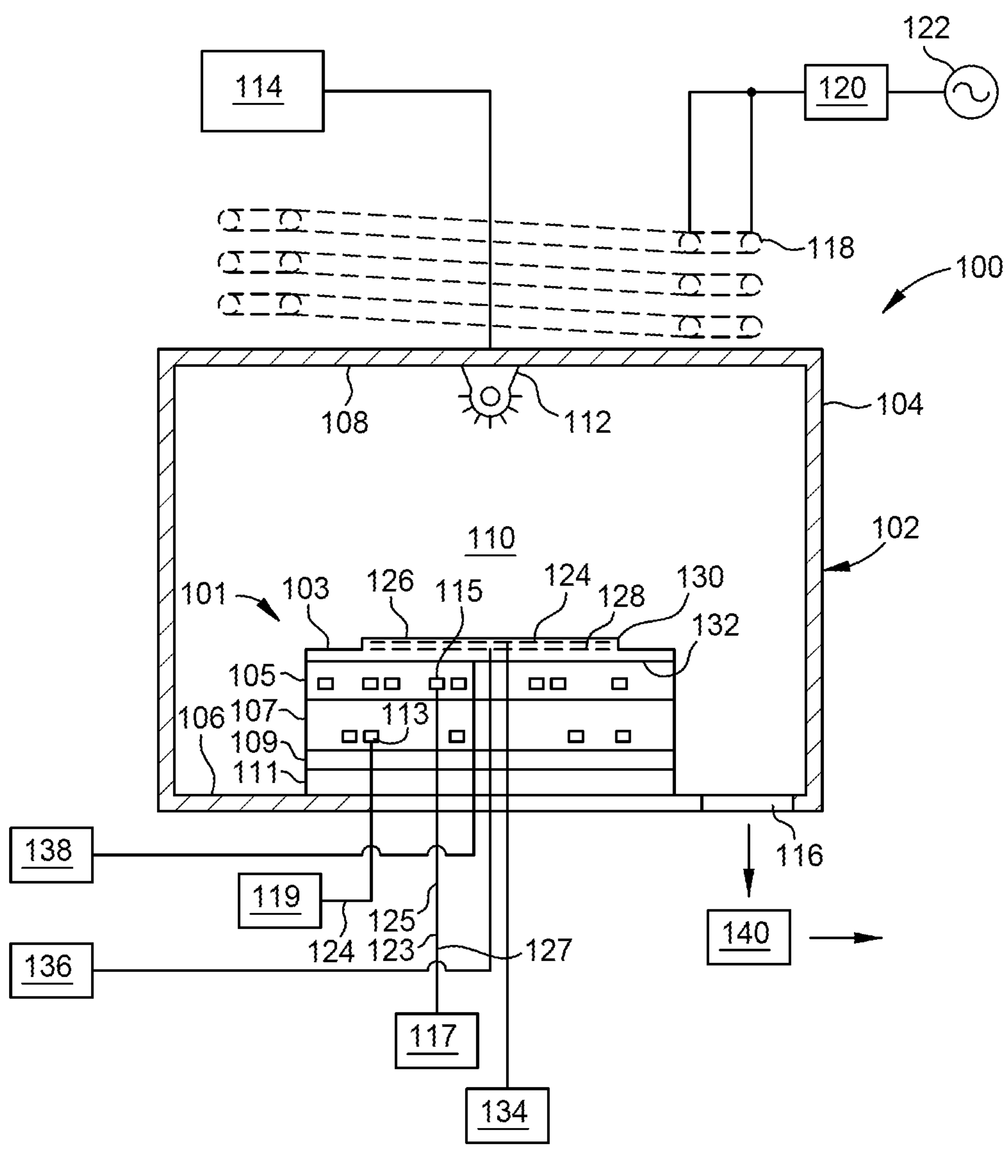
FIG. 1 is a cross-sectional schematic view of an exemplary plasma processing chamber.

FIG. 1 is a cross-sectional schematic view of an exemplary plasma processing chamber 100, having a substrate support assembly 101. The substrate support assembly 101 described may be utilized where the ability to uniformly maintain a surface or workpiece, such as a substrate 124, at a cryogenic processing temperature is desirable. Dry reactive ion etching the substrate 124 maintained at a cryogenic processing temperature enables ions to bombard the upward facing surfaces of materials disposed on the substrate 124 with decreased spontaneous etching so that trenches with smooth, vertical sidewalls are formed. For example, diffusion of ions in porosities of a low-k dielectric material disposed on the substrate 124 uniformly maintained at the cryogenic processing temperature is decreased while ions continue to bombard the upward facing surface of the low-k dielectric material to form trenches with smooth, vertical sidewalls. Additionally, selectivity of etching one material versus another can be improved at the cryogenic processing temperature. For example, selectivity between silicon (Si) and silicon dioxide ($SiO_2$) increases exponentially as temperature is decreased.

The plasma processing chamber 100 includes a chamber body 102 having sidewalls 104, a bottom 106 and a lid 108 that enclose a processing region 110. An injection apparatus 112 is coupled to the sidewalls 104 and/or lid 108 of the chamber body 102. A gas panel 114 is coupled to the injection apparatus 112 to allow process gases to be provided into the processing region 110. The injection apparatus 112 may be one or more nozzle or inlet ports, or alternatively a showerhead. Process gases, along with any processing by-products, are removed from the processing region 110 through an exhaust port 116 formed in the sidewalls 104 or bottom 106 of the chamber body 102. The exhaust port 116 is coupled to a pumping system 140, which includes throttle valves and pumps utilized to control the vacuum levels within the processing region 110.

The process gases may be energized to form a plasma within the processing region 110. The process gases may be energized by capacitively or inductively coupling RF power to the process gases. In the embodiment, which can be combined with other embodiments described herein, depicted in FIG. 1, a plurality of coils 118 are disposed above the lid 108 of the plasma processing chamber 100 and coupled through a matching circuit 120 to an RF power source 122.

The substrate support assembly 101 is disposed in the processing region 110 below the injection apparatus 112. The substrate support assembly 101 includes an ESC 103 and an ESC base assembly 105. The ESC base assembly 105 is coupled to the ESC 103 and a facility plate 107. The facility plate 107, supported by a ground plate 111, is configured to facilitate electrical, cooling, heating, and gas connections with the substrate support assembly 101. The ground plate 111 is supported by the bottom 106 of the processing chamber. An insulator plate 109 insulates the facility plate 107 from the ground plate 111. The ground plate 111 represents a grounded region of the substrate support assembly 101. The ESC 103, the ESC base assembly 105, the facility plate 107, and the insulator plate 109 represent a powered region of the substrate support assembly 101.

The ESC base assembly 105 includes a base channel 115 coupled to a cryogenic chiller 117. The cryogenic chiller 117 provides a base fluid, such as a refrigerant, to the base channel 115 so that the ESC base assembly 105, and consequently, the substrate 124, may be maintained at a predetermined cryogenic temperature. Similarly, the facility plate 107 includes a facility channel 113 coupled to a chiller 119. The chiller 119 provides facility fluid to the facility channel 113 so that the facility plate 107 is maintained a predetermined temperature. In one example, the base fluid maintains the ESC base assembly 105 at a temperature less than a temperature of the facility plate 107.

Figure 2A:
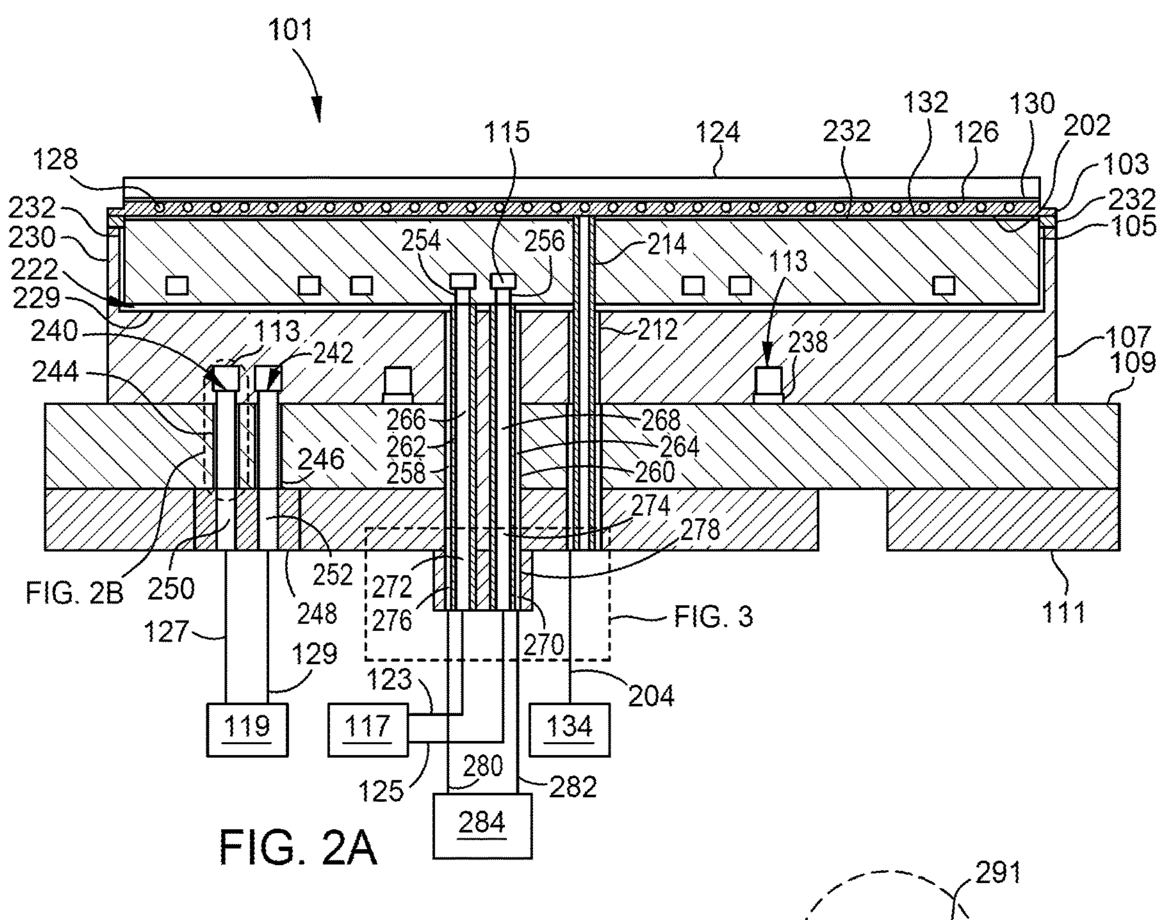
FIGS. 2A-2D are a cross-sectional schematic views of an exemplary plasma processing chamber.

Referring additionally to FIG. 2A, the cryogenic chiller 117 is in fluid communication with the base channel 115 via a base inlet conduit 123 connected to an inlet 254 of the base channel 115 and via a base outlet conduit 125 connected to an outlet 256 of the base channel 115 such that the ESC base assembly 105 is maintained at a predetermined cryogenic temperature. In one embodiment, which can be combined with other embodiments described herein, the cryogenic chiller 117 is coupled to an interface box to control a flow rate of a base fluid. The base fluid comprises a composition that remains a liquid a cryogenic temperature less than −50° C. at operating pressures. The base fluid is generally insulative so that an electrical path is not formed through the base fluid when circulated through the substrate support assembly 101. A non-limiting example of suitable facility fluid includes fluorinated heat transfer fluids. The cryogenic chiller 117 provides the base fluid, which is circulated through the base channel 115 of the ESC base assembly 105. The base fluid flowing through the base channel 115 enables the ESC base assembly 105 to be maintained at the cryogenic temperature, which assists in controlling the lateral temperature profile of the ESC 103 so that a substrate 124 disposed on the ESC 103 is uniformly maintained at the cryogenic processing temperature. In one embodiment, which can be combined in other embodiments described herein, the cryogenic chiller 117 is operable to maintain the cryogenic temperature less than about −50° C.

The chiller 119 is in fluid communication with the facility channel 113 via a facility inlet conduit 127 connected to an inlet 240 of the facility channel 113 and via a facility outlet conduit 129 connected to an outlet 242 of the facility channel 113 such that the facility plate 107 is maintained a predetermined ambient temperature. In one embodiment, which can be combined with other embodiments described herein, the chiller 119 is coupled to an interface box to control a flow rate of the facility fluid. The facility fluid may include a material that can maintain an ambient temperature between about −10° C. to about 60° C. The chiller 119 provides the facility fluid, which is circulated through the facility channel 113 of the facility plate 107. The facility fluid is generally insulative so that an electrical path is not formed through the facility fluid when circulated through the substrate support assembly 101. A non-limiting example of a suitable facility fluid includes fluorinated heat transfer fluids. The facility fluid flowing through the facility channel 113 enables the facility plate 107 to be maintained at the predetermined ambient temperature, which assists in maintaining the insulator plate 109 at the predetermined ambient temperature.

Returning primarily to FIG. 1, the ESC 103 has a support surface 130 and a bottom surface 132 opposite the support surface 130. In one embodiment, which can be combined with other embodiments described herein, the ESC 103 is fabricated from a ceramic material, such as alumina ($Al_2O_3$), aluminum nitride (AlN) or other suitable material. Alternately, the ESC 103 may be fabricated from a polymer, such as polyimide, polyetheretherketone, polyaryletherketone and the like.

The ESC 103 includes a chucking electrode 126 disposed therein. The chucking electrode 126 may be configured as a mono polar or bipolar electrode, or other suitable arrangement. The chucking electrode 126 is coupled through an RF filter and the facility plate 107 to a chucking power source 134, which provides a DC power to electrostatically secure the substrate 124 to the support surface 130 of the ESC 103. The RF filter prevents RF power utilized to form a plasma (not shown) within the plasma processing chamber 100 from damaging electrical equipment or presenting an electrical hazard outside the chamber.

The ESC 103 includes one or more resistive heaters 128 embedded therein. The resistive heaters 128 are utilized to control the temperature of the ESC 103, which is cooled by the ESC base assembly 105, such that cryogenic processing temperatures suitable for processing a substrate 124 disposed on the support surface 130 of the substrate support assembly 101 may be maintained. The resistive heaters 128 are coupled through the facility plate 107 and an RF filter to a heater power source 136. The RF filter prevents RF power utilized to form a plasma (not shown) within the plasma processing chamber 100 from damaging electrical equipment or presenting an electrical hazard outside the chamber. The heater power source 136 may provide 500 watts or more power to the resistive heaters 128. The heater power source 136 includes a controller 138 utilized to control the operation of the heater power source 136, which is generally set to heat the substrate 124 to a predetermined cryogenic temperature. In one embodiment, which can be combined with other embodiments described herein, the resistive heaters 128 include a plurality of laterally separated heating zones, wherein the controller enables at least one zone of the resistive heaters 128 to be preferentially heated relative to the resistive heaters 128 located in one or more of the other zones. For example, the resistive heaters 128 may be arranged concentrically in a plurality of separated heating zones. The resistive heaters 128 maintain the substrate 124 at a cryogenic processing temperature suitable for processing. In one embodiment, which can be combined with other embodiments described herein, the cryogenic processing temperature is less than about −10° C. For example, the cryogenic processing temperature is between about −10° C. to about −150° C.

The substrate support assembly 101 may include one or more temperature probe assemblies disposed therein. The one or more temperature assemblies are utilized to provide feedback to balance the heating and cooling provided by the ESC base assembly 105 and the resistive heaters 128 of the ESC 103 so that a desired substrate processing temperature may be maintained.

Ceramic Refrigerant Feed Tube

Referring back to FIG. 2A, the exemplary substrate support assembly 101 is configured to enable cryogenic temperature operation of ESC 103 so that a substrate 124 disposed thereon is maintained at the cryogenic processing temperature. The ESC 103 is coupled to the ESC base assembly 105. In one embodiment, which can be combined with other embodiments described herein, the ESC 103 is secured to the ESC base assembly 105 with a bonding layer 202. The bonding layer 202 may include organic or inorganic materials. In some embodiments, which may be combined with other embodiments described herein, the bonding layer 202 may include epoxy or metal materials. The chucking electrode 126 is coupled to the chucking power source 134 via a first insulated wire 204 disposed through a first bore 212 in a lower insulator of the facility plate 107 and an upper insulator 214 of the ESC base assembly 105.

The facility plate 107 includes a plate portion 229 and wall portion 230. The plate portion 229 of the ESC base assembly 105 is coupled to the facility plate 107 with one or more first screw assemblies so that a vacuum region 222 is present between the ESC base assembly 105 and the facility plate 107.

The facility plate 107 includes the wall portion 230 coupled to the ESC 103 by a seal 232. In one embodiment, which can be combined with other embodiments described herein, the lower insulator of the facility plate 107 maintains the vacuum region 222 via the seal 232. The wall portion 230 coupled to the ESC by the seal 232 protects the materials of the ESC base assembly 105 from potential corrosion and/or erosion from contact with process gases. The vacuum region 222 is defined by the ESC 103, ESC base assembly 105, facility plate 107, and seal 232. The vacuum region 222 prevents condensation on the backside of the cooling plate, prevents process gases from entering the substrate support assembly 101 by having a pressure independent of the pressure of the processing region 110, and provides for thermal isolation between the ESC base assembly 105 and facility plate 107. In one embodiment, which can be combined with other embodiments described herein, the facility plate 107 includes aluminum containing materials.

The facility channel 113 of the facility plate 107 is machined in the facility plate and seal with a cover 238. In one example, the cover 238 is welded to the facility plate 107 to seal the facility channel 113. The inlet 240 of the facility channel 113 is in fluid communication with an inlet conduit 244 disposed through the insulator plate 109 and the ground plate 111. The outlet 242 of the facility channel 113 is in fluid communication with an outlet conduit 246 disposed through the insulator plate 109 and the ground plate 111. The inlet conduit 244 and outlet conduit 246 are connected to a connection 248 having a connection inlet 250 connected to the facility inlet conduit 127 and a connection outlet 252 connected to the facility outlet conduit 129. In operation, the facility plate 107 is generally maintained in an RF hot condition.

As discussed above, the inlet conduit 244 and the outlet conduit 246 spans powered and grounded portions of the substrate support assembly 101. That is, the inlet conduit 244 and the outlet conduit 246 extend between the powered facility plate 107 and the ESC base assembly 105 (i.e., the powered portions) and the grounded insulator plate 109 and the substrate support assembly 101 (i.e., the grounded portions) of the substrate support assembly 101.

Figure 2B:
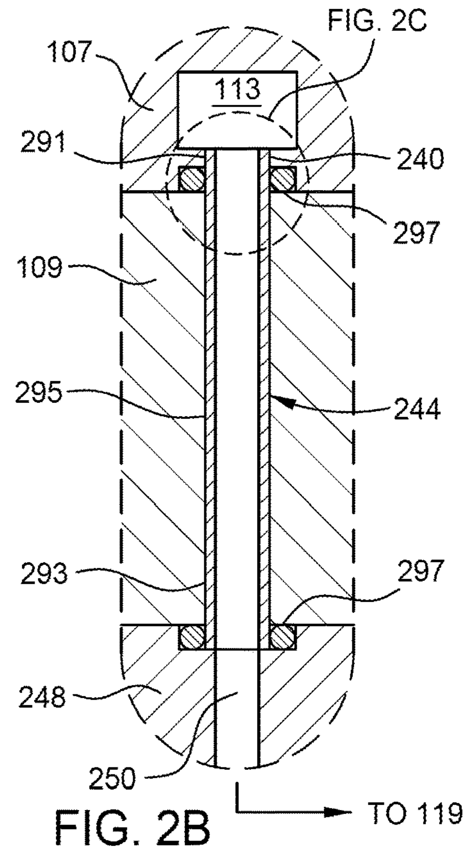
Figure 2C:
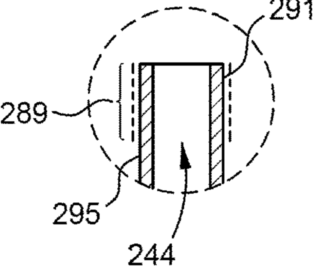

As illustrated in the enlarged portion of FIG. 2B, the conduit 244 includes a first end 291 and a second end 293. The conduit 244 also has outer surface 295 connecting the first end 291 and the second end 293. As shown in FIG. 2C, the outer surface 295 at each of the ends 291, 293 includes a sealing surface 289. The sealing surface 289 is polished to facilitate sealing with the facility plate 107 and the connection 248. In one example, the outer surface 295 at each of the ends 291, 293 is polished to at least 32 μin Ra or smoother. A seal 297 may be disposed between the polished sealing surface 289 of the outer surface 295 and the facility plate 107 and the connection 248 to prevent leakage. In one example, the seal 297 may be configured as described with reference to the seal 232, or in another suitable manner.

Figure 2D:
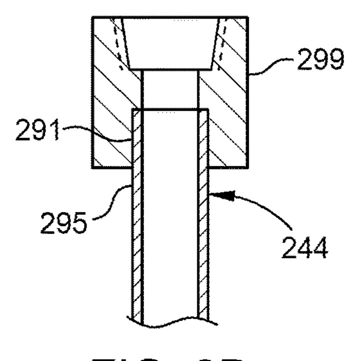

FIG. 2D illustrates an alternative sealing method. As shown in FIG. 2A', a fitting 299 may be sealingly coupled to the outer surface 295 at each of the ends 291, 293. The fitting 299 is configured to sealingly mate with a complimentary mating surface (for example, a male/female thread, compression fitting, brazing ring, and the like) of the facility plate 107 and/or the connection 248. In one example, the fitting 299 may be a metal cylinder that is brazed to the conduit 244 and to the facility plate 107 at one end 291, while a second fitting 299 is brazed to the conduit 244 and to the connection 248 at the other end 293. Although the seal 297 is illustrated and described as a piston seal, the seal 297 may alternatively be configured as a face seal.

Referring back to FIG. 2A, The base channel 115 of the ESC base assembly 105 includes an inlet 254 of the base channel 115 in fluid communication with an jacketed inlet conduit 258 disposed through the facility plate 107, the insulator plate 109, and the ground plate 111. The outlet 256 of the base channel 115 is in fluid communication with a jacketed outlet conduit 260 disposed through the facility plate 107, the insulator plate 109, and the ground plate 111. The jacketed inlet conduit 258 and jacketed outlet conduit 260 are connected to an interface block 270. In one embodiment, which can be combined with other embodiments described herein, the interface block 270 is fabricated from stainless steel. The jacketed inlet conduit 258 includes a fluid inlet conduit 266 and a vacuum channel 262. The jacketed outlet conduit 260 includes a fluid outlet conduit 268 and a vacuum channel 264. The interface block 270 includes a base inlet 272, a vacuum channel 276, a base outlet 274, and a vacuum channel 278. The base inlet 272 connects the fluid inlet conduit 266 to the base inlet conduit 123. The base outlet 274 connects the fluid outlet conduit 268 to the base outlet conduit 125. The vacuum channel 276 is connected to a vacuum conduit 280 in fluid communication with a vacuum source 284, and the vacuum channel 278 is connected to a vacuum conduit 282 in fluid communication with the vacuum source 284. Coupling the vacuum source 284 to the vacuum region 222 enables a pressure independent of the pressure of the processing region 110 to be maintained in the vacuum region 222. In one embodiment, which can be combined with other embodiments described herein, the fluid inlet conduit 266 and the fluid outlet conduit 268 are coupled to the ESC base assembly 105 by the seal 232 to maintain the pressure in the vacuum region 222.

The conduits 244, 246, 266, 268 may also be fabricated as described above, for example having ends as described with reference to FIG. 2A'. The fluid conduits 244, 246, 266, 268 may also be configured to have a sleeve 520 (FIG. 5) described in more detail below. The sleeve 520 is inserted in an electrically insulative backing tube that provides mechanical strength to the conduit and insulation against RF power.

Referring back to FIG. 2A, to prevent cracking during high-bias power applications the conduits 244, 246, 266, 268 are made from a ceramic material. For example, the ceramic material may include zirconium dioxide, yttrium oxide, magnesium oxide, or any combination thereof. In yet another example, the ceramic material may be a fired or sintered zirconia that includes, by weight percentage, 90% to 100% zirconium dioxide, 10% to 30% yttrium oxide, and 1% to 5% magnesium oxide, or any combination thereof. In one non-limiting example, the ceramic material has a desired volume resistivity in a range within about $10^4$ Ω-cm to about $10^{11}$ Ω-cm. The ceramic material has a density of about 6 g/cm. The ceramic material has a modulus of elasticity of about 192 Gpa. The ceramic material has a flexural strength of about 1,000 Mpa. The ceramic material has a coefficient of thermal conductivity of between about 4 W/m° K and about 6 W/m° K, for example about 5 W/m° K. The ceramic material has a coefficient of thermal expansion of between about 9 ppm/° C. to about 10 ppm/° C., for example about 9.5 ppm/° C.

Stated differently, the fluid conduits 244, 246, 266, 268 may comprise a ceramic material selected to withstand the higher DC voltages and RF powers, such as at RF frequencies between about 2 MHz and about 13 MHz. The conduits 244, 246, 266, 268 made from these ceramic materials have matched impedance values when the fluid conduits experience RF energy during processing, such that the impedances are matched to reduce the parasitic current loss from the conduits 244, 246 to ground. A reduced parasitic current loss on the conduits 244, 246, 266, 268 allow more current to be delivered to the generated plasma, and allows for lower bias power levels for to be used for high-bias power applications. The matched fluid conduits 244, 246, 266, 268 further provide additional cooling capabilities as the matched fluid conduits 244, 246, 266, 268 may be refrigerant conduits, according to some embodiments. Thus, preventing additional thermal energy being imparted to the matched fluid conduits 244, 246, 266, 268 enhances the cooling capabilities of the substrate support assembly 101.

Thus, this configuration of the conduits 244, 246, 266, 268 prevents cracking at high-bias RF power applications, substantially prevents arcing between the conduits 244, 246, 266, 268 grounded portion of the substrate support assembly 101, which advantageously increases the reliability, service interval and service life of the substrate support assembly 101.

Reduced Capacitance Connector for High-Bias Applications

Figure 3:
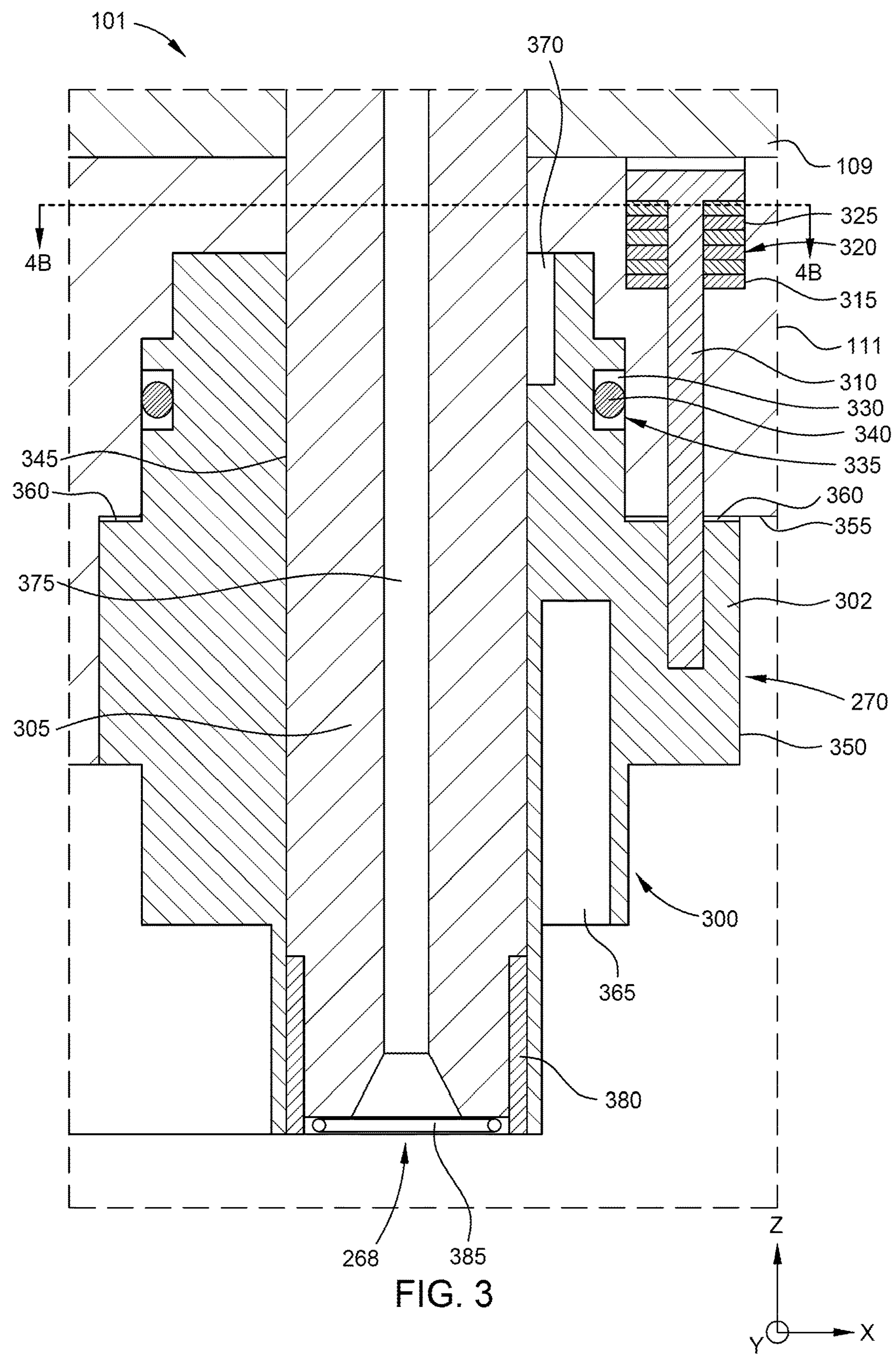
FIG. 3 is a sectional view of a portion of the substrate support assembly of FIG. 2.

FIG. 3 is a sectional view of a portion of the substrate support assembly 101 of FIG. 2. The interface block 270 includes a connector 300 that facilitates coupling of the conduits 244, 246, 266, 268 (only conduit 268 shown for simplicity) to the substrate support assembly 101. In particular, the connector 300 couples a tubular member 305 of the conduits 244, 246, 266, 268 to the ground plate 111. For example, the fluid inlet conduit 266 (not shown in FIG. 3) and fluid outlet conduit 268 include the interface block 270 with connectors 300 and the tubular member 305.

The connector 300 includes a body 302. The connector 300 is coupled to a plate of the substrate support assembly 101. For example, the connector 300 is coupled to the ground plate 111 by at least one fastener 310, such as screw or bolt. In the sectional view of FIG. 3, only one fastener is shown, but up to about three fasteners may be utilized to couple the connector 300 to the ground plate 111. A portion of the ground plate 111 includes a pocket 315 formed therein. In the sectional view of FIG. 3, only one pocket is shown, but the number of pockets is equal to the number of fasteners utilized with the connector 300. A biasing assembly 320 that is coupled to the fastener 310 is positioned in the pocket 315. The biasing assembly 320 includes a plurality of spring forms 325 that are biased against each other as well as the fastener 310 and the pocket 315. Each of the spring forms 325 compress and expand based on temperatures of the substrate support assembly 101. For example, when refrigerant is provided to the substrate support assembly 101 (e.g., when the substrate support assembly 101 is chilled), the spring forms 325 compress. When the substrate support assembly 101 is not chilled, the spring forms 325 expand. Thus, the biasing assembly 320 (one or a combination of the connector 300, the spring forms 325 and the pocket 315) allows at least vertical (Z direction) movement of the connector 300 relative to the ground plate 111 during use. Each of the spring forms 325 may be a disc-spring washer, such as a Belleville washer.

The connector 300 also includes a dynamic or sliding seal 335. The sliding seal 335 also includes an elastomeric seal 340, such as an O-ring. The sliding seal 335 allows vertical movement of the connector 300 relative to the ground plate 111 during use and maintains vacuum or negative pressures from ambient or atmospheric pressures. For example, a gap 345, formed between an outer surface of the tubular member 305 and portions of the connector 300, the insulator plate 109 and the ground plate 111 along the length of the tubular member 305, is maintained at vacuum pressures during use of the substrate support assembly 101. In contrast, an outer surface 350 of the connector 300 is in fluid communication with ambient or atmospheric conditions. Thus, the sliding seal 335 comprises a hermetic seal that maintains the pressures within and outside of the connector 300. Additionally, during use, the temperature of the substrate support assembly 101 near the sliding seal 335 is at or near room temperatures, which prevents degradation of the elastomeric seal 340.

The connector 300 is also coupled to a lower surface 355 of the ground plate 111 by a thermal gasket 360. The thermal gasket 360 is a thermally conductive gel material in the form of a pad. The thermal gasket 360 comprises a silicone material. The connector 300 also includes one or more first or lower channels 365 and one or more second or upper channels 370. While only one of the lower channels 365 and one of the upper channels 370 is shown in the sectional view of FIG. 3, the connector 300 can have three, four, or more of each of the lower channels 365 and the upper channels 370. As will be explained in more detail below, the lower channels 365 and the upper channels 370 allow vacuum pumping around the tubular member 305. For example, negative pressures can be provided through the gap 345 facilitated by pumping through the lower channels 365 and the upper channels 370.

The tubular member 305 includes a channel 375 formed along a length thereof for flowing the refrigerant to the cryogenic chillers 117, 119. The tubular member 305 also includes an end guide 380 as well as a spring seal 385. As will be explained below in FIG. 5, the tubular member 305 includes the end guide 380 and the spring seal 385 at both ends thereof.

Figure 4A:
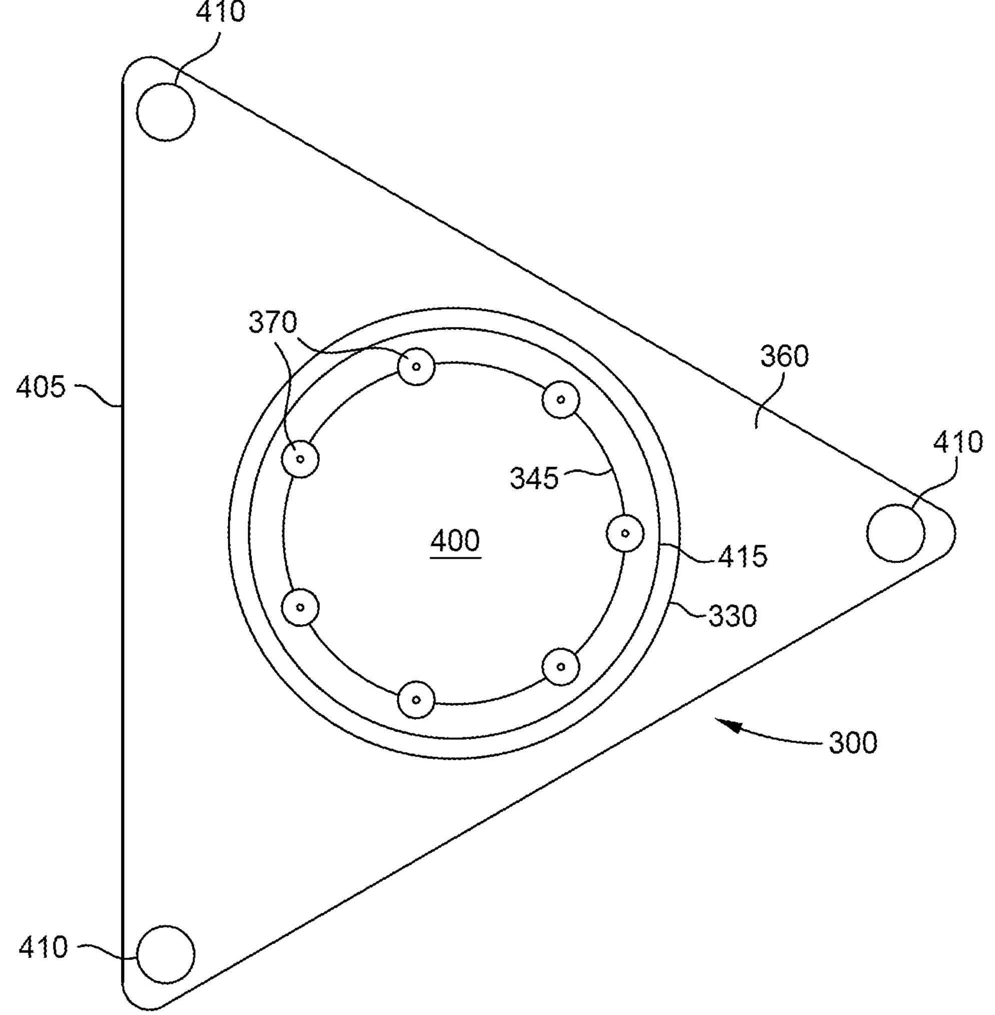
FIGS. 4A and 4B are schematic views of a connector as disclosed herein.
Figure 4B:
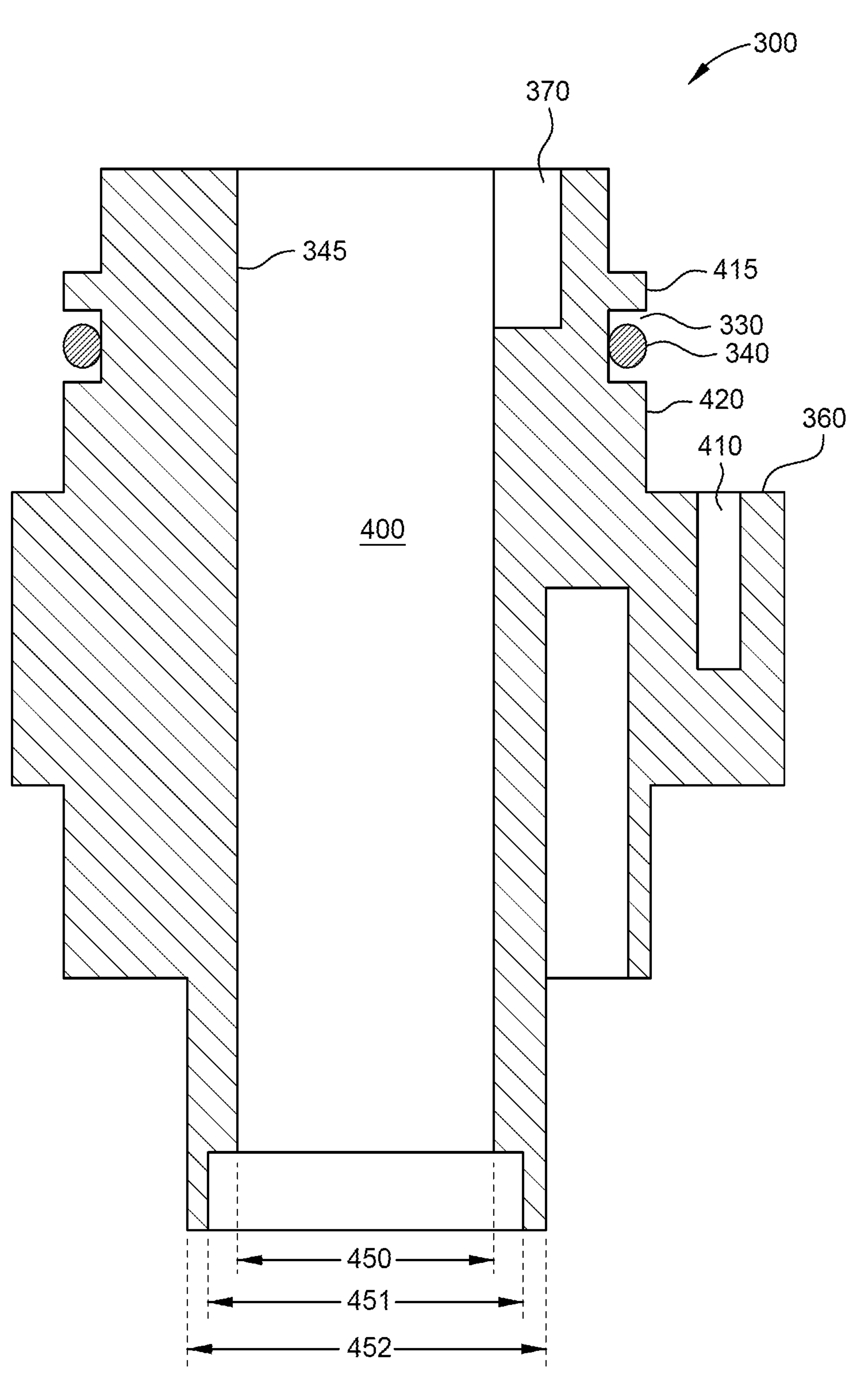

FIG. 4A is a top of the connector and FIG. 4B is cross section views of the connector 300, according to some embodiments. The connector 300 includes a central opening 400 sized to receive the tubular member 305 (FIG. 3). The central opening 400 includes an inner diameter 450, a first diameter 451, and a second diameter 452. The inner diameter 450 is the inner surface of the connector 300 and partially defines the gap 345. The inner diameter 450 is between about 0.7 inches and about 0.8 inches, for example about 0.755 inches. The first diameter 451 is between about 0.9 inches and about 1.1 inches, for example about 1 inch. The second diameter 452 is the diameter of an outer face of the connector 300. The second diameter 452 is between about 0.9 inches and about 1.1 inches, for example about 0.89 inches. Additionally, the connector 300 also includes a flange 405. The flange 405 is the connection portion of the connector 300 that enables the connector to attach to a plate within the substrate support assembly 101. The flange 405 includes a plurality of through-holes 410 each adapted to receive a fastener 310 (FIG. 3). The connector 300 also includes an upper shoulder 415 and a second or lower shoulder 420. The annular pocket 330 is defined between the upper shoulder 415 and the lower shoulder 420. The annular pocket includes the elastomeric seal 340 to seal the connector 300 when affixed within the substrate support assembly 101.

In some embodiments, the connector 300 is made of the same material as the fluid conduits, 244, 246, 266, 268. For example, the connector 300 and the fluid conduits, 244, 246, 266, 268 are ceramics. To prevent cracking during high-bias power applications the connector 300 is made of a ceramic material. For example, the ceramic material may include zirconium dioxide, yttrium oxide, magnesium oxide, or any combination thereof. In yet another example, the ceramic material may be a fired or sintered zirconia that include, by weight percentage, 90% to 100% zirconium dioxide, 10% to 30% yttrium oxide, and 1% to 5% magnesium oxide, or any combination thereof. In one non-limiting example, the ceramic material has a desired volume resistivity in a range within about $10^4$ Ω-cm to about $10^{11}$ Ω-cm. The ceramic material has a density of about 6 g/cm. The ceramic material has a modulus of elasticity of about 192 Gpa. The ceramic material has a flexural strength of about 1,000 Mpa. The ceramic material has a coefficient of thermal conductivity of between about 4 W/m° K and about 6 W/m° K, for example about 5 W/m° K. The ceramic material has a coefficient of thermal expansion of between about 9 ppm/° C. to about 10 ppm/° C., for example about 9.5 ppm/° C. The inventors have found that when the connector 300 made of the ceramic material has an inner diameter 450 of less than about 0.8 inches, each of the fluid conduits, 244, 246, 266, 268 have a conduit impedance of less than 1000Ω. Additionally, when the connector and the fluid conduits 244, 246, 266, 268 experience an RF bias, a total assembly including a connector 300 and a single fluid conduit of the fluid conduits 244, 246, 266, 268 has a lower assembly impedance. For example, when a connector 300 and a fluid conduit 268 experience about a 20 Hz bias frequency, the assembly has an assembly impedance of about $1.5\times10^8\Omega$. For example, when a connector 300 and a fluid conduit 268 experience about a 2 MHz bias frequency, the assembly has an assembly impedance of about $2.12\times10^4\Omega$. For example, when a connector 300 and a fluid conduit 268 experience about a 13.56 MHz bias frequency, the assembly has an assembly impedance of about $3.18\times10^3\Omega$.

Figure 5:
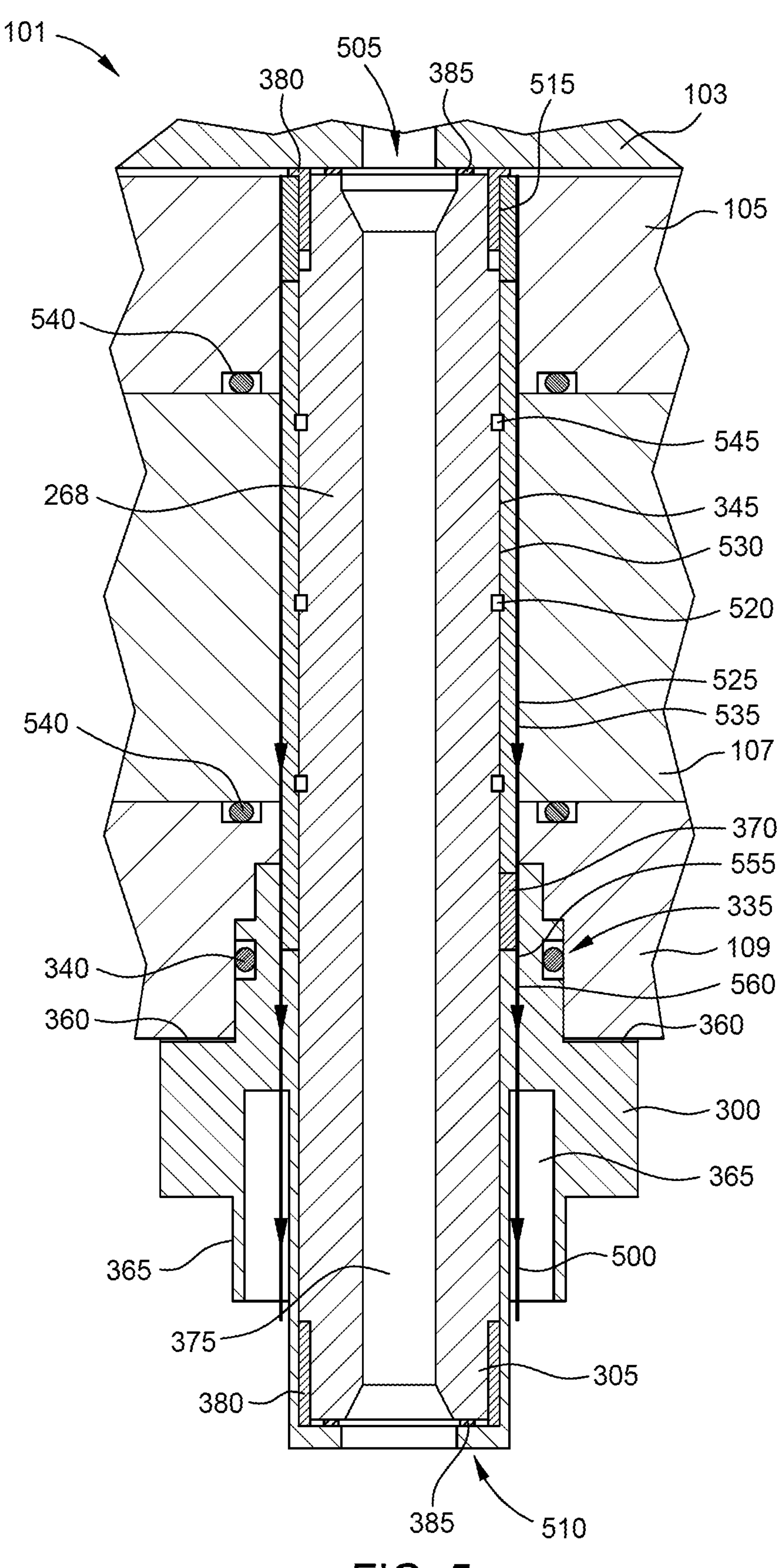
FIG. 5 is a schematic sectional view showing one embodiment of a connector through the substrate support assembly as described herein.

FIG. 5 is a schematic sectional view showing one embodiment of a vacuum path 500 through the substrate support assembly 101. The vacuum path 500 is shown by arrows in FIG. 5. The vacuum path 500 is a conductance path from a first end 505 of the tubular member 305 to a second end 510 of the tubular member 305. The conductance path includes flow through openings 515 in the end guide 380 to the gap 345. In some embodiments, a portion of the outer surface of the tubular member 305 includes the sleeve 520. The sleeve 520 may be made from polytetrafluoroethylene (Teflon), for example, the sleeve is a polytetrafluoroethylene sleeve 520. The sleeve 520 includes a gap 525 formed between an outer surface thereof, and the ESC base assembly 105, the insulator plate 109, and the ground plate 111. The sleeve 520 may surround the outer surface of the tubular member 305. The sleeve 520 may extend between the ESC 103 and the second end 510 of the tubular member 305. The sleeve 520 advantageously isolates the RF hot ESC 103 and ground, preventing the tubular member 305 from cracking.

Furthermore, the sleeve 520 increases the resistance of the tubular member 305 with respect to ground. In turn, this reduces the parasitic current loss of the tubular member 305 which reduces ohmic heating of the tubular member 305. Stated differently, the sleeve 520 isolates the tubular member from the cryogenic temperatures of one side of the chamber and the RF hot temperatures on the other side of the chamber. The sleeve 520 reduces the thermal energy experience by the tubular member 305 caused by the difference in temperatures and prevents in from cracking.

In some embodiments, the gap 345 is an inner channel 530 and the gap 525 is an outer channel 535. Seals 540, such as O-rings, as well as the sliding seal 335, seal the conductance path through the various layers the tubular member 305 extends through. In some embodiments, the inner channel 530 comprises a helical or spiral channel 545 that includes a portion formed in the outer surface of the tubular member 305 and an inner surface of the sleeve 520.

The conductance path also flows through ports 555 formed in the sleeve 520 that are in fluid communication with the inner channel 530 and/or the outer channel 535. The conductance path also extends into the connector 300 via a plurality of longitudinal channels 560 that are in fluid communication with the lower channels 365 of the connector 300.

As shown in FIG. 5, both of the first end 505 and the second end 510 include a spring seal 385. The spring seals 385 comprise a coil spring made of a metallic material, such as stainless steel. Also shown in FIG. 5, both of the first end 505 and the second end 510 of the tubular member 305 include an end guide 380.

As shown in both FIG. 3 and FIG. 5 the connector 300 can be used in multiple locations. For example, according to embodiments shown in FIG. 3, the connector 300 can be utilized at the interface between the insulator plate 109 and the ground plate 111. In yet another example, according to embodiments shown in FIG. 5, the connector 300 can be utilized at the interface between the ground plate 111 and the sidewalls 104 of the chamber body 102 (FIG. 1).

The use of the described connector and fluid conduits has yielded a substrate support assembly with better resistance to ohmic heating due to parasitic RF current. The resistance also reduces current losses, thereby enabling lower energy requirements for the process chamber. Additionally, the connector and fluid conduits have better fracture resistance due to the improvements in thermal expansion coefficients of the ceramic material.

While the foregoing is directed to examples of the present disclosure, other and further examples of the disclosure may be devised without departing from the basic scope thereof, and the scope thereof is determined by the claims that follow.

What is claimed is:

1. A semiconductor chamber component, comprising:
a powered region;
a grounded region; and
a ceramic fluid conduit disposed within a gap of the semiconductor chamber component, the gap passing through the powered region and grounded region.

2. The semiconductor chamber component of claim 1, wherein the ceramic fluid conduit comprises zirconia.

3. The semiconductor chamber component of claim 1, further comprising a connector disposed at an interface of the powered region and the grounded region.

4. The semiconductor chamber component of claim 3, wherein the ceramic fluid conduit and the connector are the same material.

5. The semiconductor chamber component of claim 1, wherein the ceramic fluid conduit has a volume resistivity between about $10^4$ to about $10^{11}$ Ω-cm.

6. The semiconductor chamber component of claim 3, wherein when the connector and the ceramic fluid conduit experience a bias frequency of about 2 MHz, the connector and the ceramic fluid conduit have an impedance of about $2.12\times10^4\Omega$.

7. The semiconductor chamber component of claim 1, wherein the ceramic fluid conduit is disposed within a polytetrafluoroethylene sleeve.

8. The semiconductor chamber component of claim 1, wherein the ceramic fluid conduit is a refrigerant conduit.

9. The semiconductor chamber component of claim 1, wherein the ceramic fluid conduit has a coefficient of thermal conductivity of between about 4 W/m° K and about 6 W/m° K.

10. A substrate support assembly comprising:
a facility plate;
an insulator plate disposed between a ground plate and the facility plate;
a fluid conduit disposed within the substrate support assembly disposed through the facility plate and insulator plate; and
a connector coupled to the ground plate that houses a portion of the fluid conduit, the connector comprising a central opening having an inner diameter between about 0.7 inches and about 0.8 inches.

11. The substrate support assembly of claim 10, wherein the fluid conduit and the connector are the same material.

12. The substrate support assembly of claim 11, wherein the fluid conduit and the connector are ceramics.

13. The substrate support assembly of claim 12, wherein a volume resistivity of the fluid conduit is between about $10^4$ Ω-cm to about $10^{11}$ Ω-cm.

14. The substrate support assembly of claim 13, wherein the connector further comprises a flange with a plurality of through holes.

15. The substrate support assembly of claim 10, wherein the fluid conduit is disposed within a polytetrafluoroethylene sleeve.

16. The substrate support assembly of claim 10, wherein the connector is disposed and in contact with the ground plate.

17. The substrate support assembly of claim 10, wherein when the connector and the fluid conduit experience about a bias frequency of about 13.56 MHz, the connector and the fluid conduit have an impedance of about $3.18\times10^3\Omega$.

18. The substrate support assembly of claim 10, wherein the connector and the fluid conduit have a coefficient of thermal expansion of between about 9 ppm/° C. to about 10 ppm/° C.

19. A substrate support assembly comprising:

a facility plate;

a ground plate coupled to the facility plate;

a ceramic fluid conduit disposed within a gap of the substrate support assembly, the gap disposed through the facility plate and the ground plate, the ceramic fluid conduit comprising an outer surface surrounded by a polytetrafluoroethylene sleeve; and a connector coupled to the ground plate that houses a portion of the ceramic fluid conduit, the connector coupling a tubular member of the ceramic fluid conduit to the ground plate, the connector and the ceramic fluid conduit comprising a same ceramic material.

20. The substrate support assembly of claim 19, where in the connector further comprises an opening with a diameter between about 0.7 inches and about 0.8 inches.

* * * * *